United States Patent [19]

Barry

[11] Patent Number: 5,157,625

[45] Date of Patent: Oct. 20, 1992

[54] RADIATION RESISTANT SRAM MEMORY CELL

[75] Inventor: Michael J. Barry, Colorado Springs, Colo.

[73] Assignee: United Technologies Corporation, Hartford, Conn.

[21] Appl. No.: 526,758

[22] Filed: May 22, 1990

[51] Int. Cl.$^5$ .................. G11C 11/40; G11C 11/26; G11C 13/00

[52] U.S. Cl. ............................ 365/154; 365/211

[58] Field of Search .............. 365/189.01, 154, 156, 365/211

[56] References Cited

U.S. PATENT DOCUMENTS 5,111,429  5/1992  Whitaker ...................... 365/154

Primary Examiner—Terrell W. Fears

[57] ABSTRACT

A memory cell employs four interconnected modules, each having two inputs and a truth table that has a logic level for input states and provides for a high impedance output state for unallowed states which differ from an allowed state by the status of one input. The interconnection is such that each module of a pair has as inputs the outputs of both members of the other pair, so that if one module changes state, the inputs to the members of the other will be in one of the unallowed states that produces a high impedance output. Thus, a radiation induced change of state in one module will not propagate through the system, but will be restored to an allowed state by action of the unaffected modules.

13 Claims, 1 Drawing Sheet

RADIATION RESISTANT SRAM MEMORY CELL

TECHNICAL FIELD

The field of the invention is that of static ram (SRAM) memory cells resistant to radiation.

BACKGROUND ART

It is known in the art that radiation that strikes an SRAM memory cell can cause it to assume an incorrect state. If, in a conventional cross-coupled inverter SRAM cell, one node switches state, that will force the other node to follow suit, resulting in a stable configuration that contains incorrect data. The conventional way to make an SRAM cell radiation resistant is to add large polysilicon resistors in series with the inputs for each of the cross-coupled inverters. One drawback of this approach is that the formation of polysilicon resistors is a difficult step in the integrated circuit fabrication process. Further, the magnitude of the resistance is very sensitive to processing parameters and to the temperature of the device. In particular, for devices that must operate across the military specification range, this temperature dependence requires compensation in order to provide a device that works across the full temperature range. At cold temperatures, the resistance is very large, which greatly increases the time required to write data into the memory, and slows down the effective speed of the memory. At high temperatures, the resistance is smaller than at room temperature, which decreases the protection against radiation induced errors. The art has sought an SRAM memory cell that is resistant to radiation induced errors and is also not dependent on these temperature effects.

DISCLOSURE OF INVENTION

The invention relates to an improved SRAM cell in which four cross-coupled circuit modules are used with four data storage nodes. These modules are interconnected in the sense that they are arranged in two pairs and each member of the first pair has its output node connected to inputs on both members of the second pair, while each member of the second pair has its output node connected to inputs on both members of the first pair. The 11 and 00 input states produce outputs that are the same as corresponding states of a NAND gate. The other two states, the 10 and 01 inputs, produce a high-impedance connected to the output node so that the output state will be initially held in its former state by the capacitance of the output node and slowly drift to the 1 or the 0 state depending on the current leakage to the particular node.

As a result of this configuration, a radiation induced change in one of the four data storage nodes will not propagate through the circuit. The change in state of a data storage node will be restored in a time that is determined by the current passing into or out of the output terminal node.

Other features and advantages will be apparent from the specification and claims and from the accompanying drawings which illustrate an embodiment of the invention.

BEST MODE FOR CARRYING OUT THE INVENTION

Figure 1:
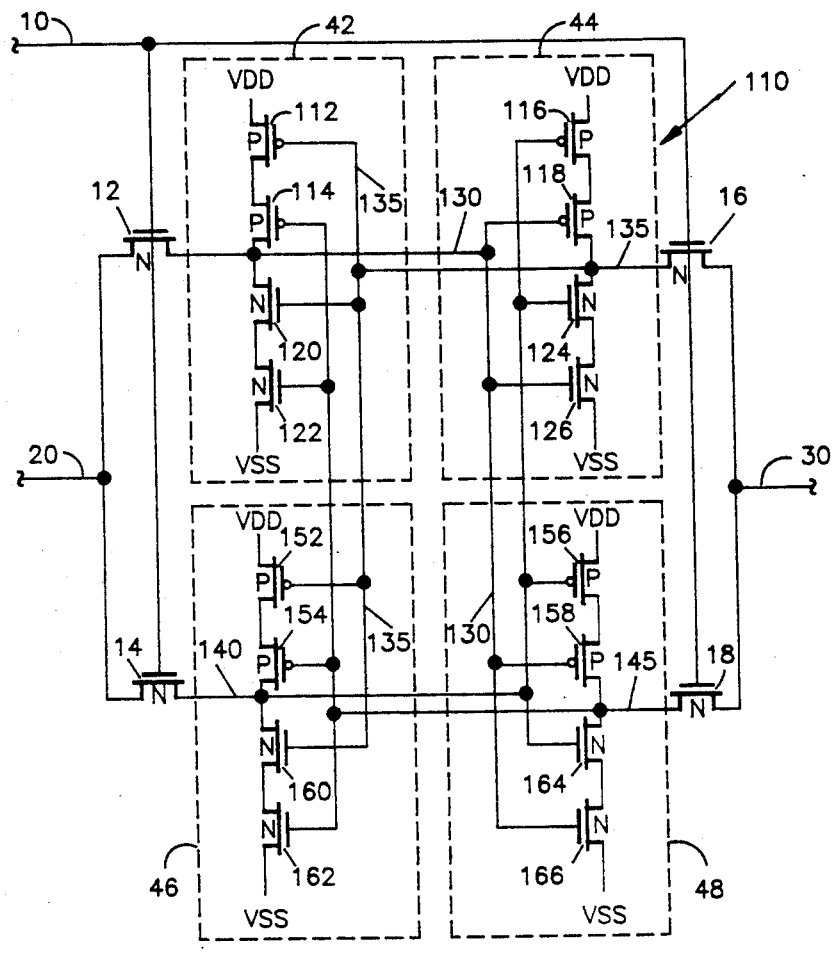
FIG. 1 illustrates in schematic form an embodiment of the invention.

Referring now to FIG. 1, there is shown a typical SRAM cell constructed according to the invention, in which a row line 10 enters at the top and extends to control four N-channel pass transistors 12, 14, 16 and 18. An I/O column line 20 enters from the left and an I/O line 30 enters from the right. Four individual circuit modules, indicated by dotted lines and the numerals 42, 44, 46 and 48, comprise the elements of the memory cell. Four data storage nodes 130, 135, 140 and 145 interconnect the modules. As was mentioned above, the configuration of the modules and their interconnections combine to provide resistance to a transient state change on one of the data storage nodes. These modules follow the truth table in Table I, in which A and B denote inputs and C denotes the output. An X indicates a high impedance output state corresponding to an unallowed input state.

In a storage operation, row line 10 will go high, opening pass transistors 12, 14, 16 and 18 to signals on I/O lines 20 and 30. Current will pass through the transistors and force nodes 130 and 140 to assume the state on line 20. Similarly, nodes 135 and 145 will be forced to the state of line 30. Lines 20 and 30 will have opposite voltage states, of course.

Node 130 connects the output node of module 42 to one of two inputs to each of modules 44 and 48, controlling transistors 118 and 126 in module 44 and transistors 158 and 166 in module 48. Corresponding transistors in the modules are indicated by numerals that differ by forty. Similarly, node 140 connects the output node of module 46 to the other of two inputs to modules 44 and 48, controlling the gates of transistors 116 and 124 in module 44 and transistors 156 and 164 in module 48. Thus, when the output nodes of modules 42 and 46 are forced into one state by line 20, and the input gates of all transistors in modules 44 and 48 are forced into the same state. The output nodes 135 and 145 will then assume the corresponding inverted state from that of line 20, as have the input gates of modules 42 and 46 to assume a stable configuration for the whole circuit. Configurations are shown in Table II.

If a radiation induced upset occurs on node 130, say, then that output node of module 42 will change state and the gates of transistors 118, 126 158 and 166 will change state also. The output nodes 135 and 145 of modules 44 and 48 will, however, not change state immediately because node 140 has not been affected by the radiation and therefore the remaining inputs of modules 44 and 48 have not changed state. With their inputs in either the allowed 1,0 or 0,1 states, modules 44 and 48 will have a high impedance connected to nodes 135 and 145, Which would eventually drift by leakage to one state or the other. Long before that time, however, node 130 will recover by current flowing through transistors 112–114 or through 120–122. These transistors represent a relatively low impedance path that will restore node 130 long before nodes 135 and 145 drift away from their previous state. For example, if nodes 130 and 140 were at 0 volts and nodes 135 and 145 were correspondingly at +5 volts and node 130 received a transient charge that raised it to +4 volts, nodes 135 and 145 would switch to the high impedance state at a value of +5 volts. This voltage would keep transistors 120 and 122 on until the voltage on nodes 135 and 145 leaked below the turn on voltage of these transistors. Long before that happened, the deleted charge on node 130 would have been replaced by current passing through transistors 120 and 122 and node 130 would have dropped back to its previous stable state of 0 volts.

Good engineering practice will cause the nodes to be laid out and the connections between them to the laid out in a manner as widely separated as is consistent with reasonable packing density, so that radiation charge coming from a radioactive particle will not affect two nodes at the same time. If two nodes do switch, then the circuit will change state as in the prior art.

The state of the memory cell is read out in a conventional manner, in which line 10 goes high and I/O lines 20 and 30 assume the states that are on nodes 130 and 140 and on nodes 135 and 145, respectively.

Those skilled in the art will readily be able to construct different embodiments of this invention in the light of this disclosure. For example, the pass transistors might be P-channel or a mixture of N and P channels. The individual transistors have been shown as separate, but dual-gate FETS may be more compact. The circuit may be implemented with bipolar transistors, also.

Figure 2A:
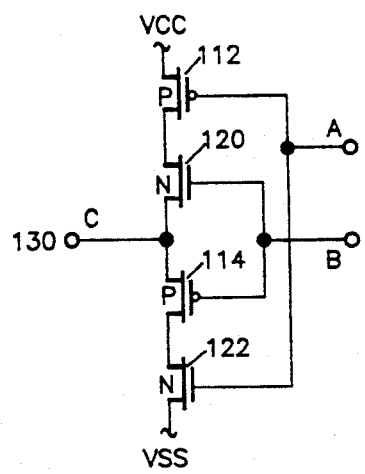
FIGS. 2a and 2b illustrates in schematic form an alternative embodiment of the invention.
Figure 2B:
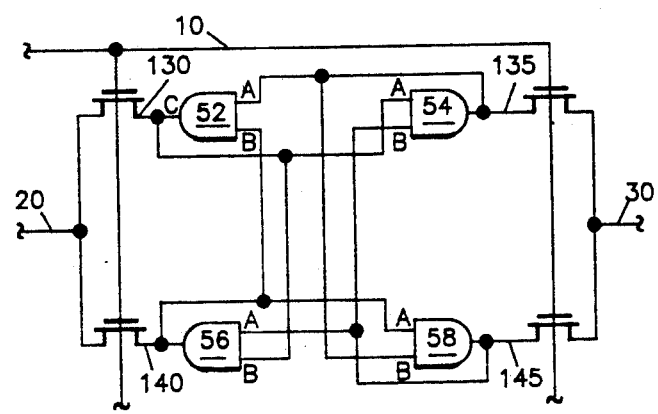

An alternate form for the four modules is illustrated in FIG. 2a, having the truth table of Table III. A memory cell employing these other modules is shown in FIG. 2b and the logic relationships are shown in Table IV. In FIG. 2a, the same four transistors 112, 114, 120 and 122 of module 42 of FIG. 1 are rearranged as the P-N pair in module 52. Module 52 will not be able to pull node 130 all the way to $V_{dd}$ or to $V_{ss}$ because there is an N-channel transistor in the upper leg and a P-channel transistor in the lower leg, but that merely means that the voltage swing in the I/O lines will be less than in the preferred embodiment of FIG. 1. A comparison of Table I and III reveals that both types of modules have the four input states of a device having two input terminals and have these; output states on terminal 130; a low-impedance logic 0 output state; a low impedance logic 1 output and a high-impedance output state. The input states that correspond to the logic 1 and logic 0 states will be referred to as "allowed" states and the other two states will be referred to as "unallowed" states. It is evident that allowed input states on all modules correspond to a stable state of the memory cell and the presence of an unallowed input state on one of the modules corresponds to a transient state in which one data storage node has been flipped by radiation.

An important point that may be ascertained from the truth tables is that each unallowed state differs from an allowed state by a change in one input, so that a radiation-induced change on a data storage node will cause the two modules connected to it to assume the high-impedance output state that retains the previous voltage of the stable state (logic 1 or 0) that these modules were in before the transient occurred.

The condition on the modules is that they have two inputs with two allowed states corresponding to the logic 1 and logic 0 output states and two unallowed states corresponding to the high impedance output state, and that each of the unallowed states differs from an allowed state by the status of one of the inputs.

It should be understood that the invention is not limited to the particular embodiments shown and described herein, but that various changes and modifications may be made without departing from the spirit and scope of this novel concept as defined by the following claims.

TABLE I

| A | B | C |
|---|---|---|
| 1 | 1 | 0 |
| 1 | 0 | X |
| 0 | 1 | X |
| 0 | 0 | 1 |

TABLE II

| MODULE | 42 | | | 44 | | | 46 | | | 48 | | |
|---|---|---|---|---|---|---|---|---|---|---|---|---|
| TERMINAL | A | B | C | A | B | C | A | B | C | A | B | C |
| NODE | 135 | 145 | 130 | 140 | 130 | 135 | 135 | 145 | 140 | 140 | 130 | 145 |
| STATE I | 0 | 0 | 1 | 1 | 1 | 0 | 0 | 0 | 1 | 1 | 1 | 0 |
| STATE II | 1 | 1 | 0 | 0 | 0 | 1 | 1 | 1 | 0 | 0 | 0 | 1 |

TABLE III

| A | B | C |
|---|---|---|
| 1 | 1 | X |
| 1 | 0 | 0 |
| 0 | 1 | 1 |
| 0 | 0 | X |

TABLE IV

| MODULE | 52 | | | 54 | | | 56 | | | 58 | | |
|---|---|---|---|---|---|---|---|---|---|---|---|---|
| TERMINAL | A | B | C | A | B | C | A | B | C | A | B | C |
| NODE | 135 | 140 | 130 | 130 | 145 | 135 | 145 | 130 | 140 | 140 | 135 | 135 |
| STATE I | 0 | 1 | 1 | 1 | 0 | 0 | 0 | 1 | 1 | 1 | 0 | 0 |
| STATE II | 1 | 0 | 0 | 0 | 1 | 1 | 1 | 0 | 0 | 0 | 1 | 1 |

What is claimed is:

1. A memory cell resistant to state change comprising:
    four circuit modules each having two input terminals and an output terminal and having a low-impedance logic 1 output state, a low-impedance logic 0 output state, and a high-impedance output state on said output terminal corresponding to predetermined input states of said two input terminals;
    four data storage nodes, each connected to a corresponding output terminal of said four circuit modules and one of said two input terminals of a predetermined pair of said four circuit modules;
    each of said four circuit modules has first and second allowed input states, each corresponding to one of said logic 1 output state and said logic 0 output state, and first and second transient input states, each corresponding to said high impedance output state, and said allowed and transient input states are related such that each of said allowed states differs from one of said transient states by the status of only one input, whereby the temporary transition of one of said two inputs causes said output terminal to switch from one of said low-impedance output states to a high impedance output state initially having its former voltage value.

2. A memory cell according to claim 1, in which each of said four circuit modules comprises two transistors connected in series in a first half portion between a first voltage terminal of one polarity and said output terminal and two transistors connected in series in a second half portion between said output terminal and a second voltage terminal; and each of said two input terminals is connected to one of said two transistors in each of said first and second half portions, so that for each of said allowed input states one of said first and second half portions forms a low impedance path between a voltage terminal and said output terminal and the other of said first and second half portions forms a high impedance path between a voltage terminal and said output terminal and for each of said transient input states both of said first and second half portions forms a high impedance path between a voltage terminal and said output terminal.

3. A memory cell according to claim 2, in which both of said two transistors in said first half portion are of a first polarity and both of said two transistors in said second half portion are of a second polarity opposite to said first polarity.

4. A memory cell according to claim 3, in which said first polarity is P-type and said second polarity is N-type.

5. A memory cell according to claim 3, in which one of said two transistors in each of said first and second half portions is of said first polarity and the other of said two transistors in each of said first and second half portions is of said second polarity.

6. A memory cell according to claim 1, in which said four circuit modules are grouped in a first pair and a second pair;

said output terminal of a first member of said first pair is connected to first predetermined input terminals of both members of said second pair;

said output terminal of a second member of said first pair is connected to second predetermined input terminals of both members of said second pair;

said output terminal of a first member of said second pair is connected to third predetermined input terminals of both members of said first pair; and said output terminal of a second member of said second pair is connected to fourth predetermined input terminals of both members of said first pair.

7. A memory cell according to claim 6, in which said output terminal of said first member of said first pair and said output terminal of said second member of said first pair are connected through respective output gate means to a common first terminal of said memory cell.

8. A memory cell according to claim 6, in which each of said four circuit modules comprises two transistors connected in series in a first half portion between a first voltage terminal of one polarity and said output terminal and two transistors connected in series in a second half portion between said output terminal and a second voltage terminal; and each of said two input terminals is connected to one of said two transistors in each of said first and second half portions, so that for each of said allowed input states one of said first and second half portions forms a low impedance path between a voltage terminal and said output terminal and the other of said first and second half portions forms a high impedance path between a voltage terminal and said output terminal and for each of said transient input states both of said first and second half portions forms a high impedance path between a voltage terminal and said output terminal.

9. A memory cell according to claim 8, in which both of said two transistors in said first half portion are of a first polarity and both of said two transistors in said second half portion are of a second polarity opposite to said first polarity.

10. A memory cell according to claim 9, in which said first polarity is P-type and said second polarity is N-type.

11. A memory cell according to claim 1, in which said four circuit modules are grouped in a first pair and a second pair;

said output terminal of a first member of said first pair is connected to a first input terminal of a first member of said second pair and to a second input terminal of a second member of said first pair;

said output terminal of a first member of said second pair is connected to a first terminal of said first member of said first pair and to a second terminal of a second member of said second pair;

said output terminal of a second member of said first pair is connected to a second terminal of said first member of said first pair and to a first terminal of said second member of said second pair; and said output terminal of said second member of said second pair is connected to a first terminal of said second member of said first pair and to a first terminal of said second member of said second pair.

12. A memory cell according to claim 11, in which each of said four circuit modules comprises two transistors connected in series in a first half portion between a first voltage terminal of one polarity and said output terminal and two transistors connected in series in a second half portion between said output terminal and a second voltage terminal; and each of said two input terminals is connected to one of said two transistors in each of said first and second half portions, so that for each of said allowed input states one of said first and second half portions forms a low impedance path between a voltage terminal and said output terminal and the other of said first and second half portions forms a high impedance path between a voltage terminal and said output terminal and for each of said transient input states both of said first and second half portions forms a high impedance path between a voltage terminal and said output terminal.

13. A memory cell according to claim 12, in which one of said two transistors in each of said first and second half portions is of said first polarity and the other of said two transistors in each of said first and second half portions is of said second polarity.

* * * * *